United States Patent [19]

Bullis

[11] 4,445,064

[45] Apr. 24, 1984

[54] SELF RESONANT POWER SUPPLY FOR ELECTRO-ACOUSTICAL TRANSDUCER

[75] Inventor: David C. Bullis, Kennett Square, Pa.

[73] Assignee: E. I. Du Pont de Nemours and Company, Wilmington, Del.

[21] Appl. No.: 488,374

[22] Filed: Apr. 25, 1983

[51] Int. Cl.³ .............................................. H01L 41/08

[52] U.S. Cl. ...................................................... 310/316

[58] Field of Search ................................ 310/316-319, 310/26; 318/116, 118

[56] References Cited

U.S. PATENT DOCUMENTS

| | | | |
|---|---|---|---|
| 3,379,972 | 4/1968 | Foster et al. | 310/316 X |
| 3,432,691 | 3/1969 | Shoh . | |
| 3,489,930 | 1/1970 | Shoh | 310/316 |
| 3,668,486 | 6/1972 | Silver . | |
| 3,736,523 | 5/1973 | Puskas | 310/316 X |
| 4,047,992 | 9/1977 | Williams et al. . | |
| 4,271,371 | 6/1981 | Furuichi et al. | 310/316 |
| 4,277,710 | 7/1981 | Harwood et al. . | |
| 4,282,496 | 8/1981 | Heuner . | |

OTHER PUBLICATIONS

Van Der Burgt, *Motional Positive Feedback Systems for Ultrasonic Power Generators,* IEEE Trans. on Sonics & Ultrasonics, Jul. 1963.

Bullis and Budak, *Response of Ultrasonic Motional Bridge Circuits under Resistive and Reactive Loads,* IEEE Trans. on Sonics & Ultrasonics, Mar. 1982.

*Primary Examiner*—Mark O. Budd

[57] ABSTRACT

A motional bridge circuit for generating feedback signals proportional to the vibration of an ultrasonic transducer is modified by means of an active filter in the feedback circuit which is coupled to a starting circuit that raises the Q of the active filter when a signal is not present in the feedback loop to change the active filter from a mode suppressant to a self-oscillating state.

3 Claims, 4 Drawing Figures

SELF RESONANT POWER SUPPLY FOR ELECTRO-ACOUSTICAL TRANSDUCER

BACKGROUND OF THE INVENTION

This invention relates to a power supply for driving electro-acoustical transducers under varying operating loads, and more particularly, it relates to a self resonant power supply for driving such transducers. The use of ultrasonic energy for such applications as cleaning, dispersing, welding, and materials treatment involves conversion of electrical power in the form of sinusoidal voltage and current into mechanical vibration. This is usually accomplished through the use of a transducer comprised of a piezoelectric crystal sandwiched between a metal back plate and a sonic energy impedance transformer or horn. When a sinusoidal voltage drive of approximately the same frequency as the mechanical resonance of the transducer is applied to the crystal, the transducer vibrates longitudinally. Piezoelectric transducers are high-Q devices which are particularly well suited for coupling large amounts of acoustic power into loads at a prescribed frequency with little loss, or internal power dissipation. A high-Q device is one that has the ability to resonate with very little expenditure of power needed to excite it. However, a price is exacted in realizing this advantage; that is, an electro-acoustic transducer is very unstable in the vicinity of its operating frequency.

Various solutions to the stability problem appear in the literature and patent art. These solutions usually encompass feedback control loops that include separate free-running oscillators, or other fixed frequency excitation sources such as power line AC voltages. The object in each case is to provide a way to maintain within tolerance the vibrational power input levels to the transducer. This must be done in view of the transducer's natural tendency to fall out of one condition of longitudinal resonance, as the acoustic load changes, and enter into the others.

In addition to providing regulated input power to the transducer to prevent damage, the power drive circuit must track the changing transducer characteristics and maintain constant the amplitude of vibration of the transducer horn or tip. This additional requirement is necessary when mixing certain types of fluids with critical physical properties, such as viscosity and tendancy of entrained particulates to coagulate. These properties are critically dependent upon the power supply being able to maintain tight control over the tip displacement and frequency of vibration.

SUMMARY OF THE INVENTION

The instant invention overcomes this problem by providing a feedback control circuit for the transducer with an improved closed loop frequency response and a means of insuring that oscillations are initiated on frequency while using the transducer itself as the primary frequency determining element.

According to the invention a circuit for energizing by means of a motional bridge circuit an electro-acoustical transducer coupled to a load for transferring acoustic energy thereto is provided that includes, a power drive circuit coupled to the motional bridge circuit for supplying an alternating current output for establishing a current flow to said transducer, and a feedback circuit connecting the motional bridge circuit to the power drive circuit for applying thereto an alternating current signal. An active filter in said feedback circuit which is normally in a mode suppressant state, includes a starting circuit that is coupled to said active filter for raising the Q of the active filter until it reverts from said mode suppressant state to a self-oscillating state when the alternating current signal in the feedback circuit is not present and for lowering the Q of said active filter until it reverts back to said mode suppressant state when the alternating current signal in the feedback circuit is present.

In the preferred embodiment of the invention the starting circuit is coupled to the active filter by means of a photoresistor and to an all pass phase shifter which is in the feedback loop connected to the input of the active filter.

DESCRIPTION OF THE PREFERRED EMBODIMENT

Figure 1:
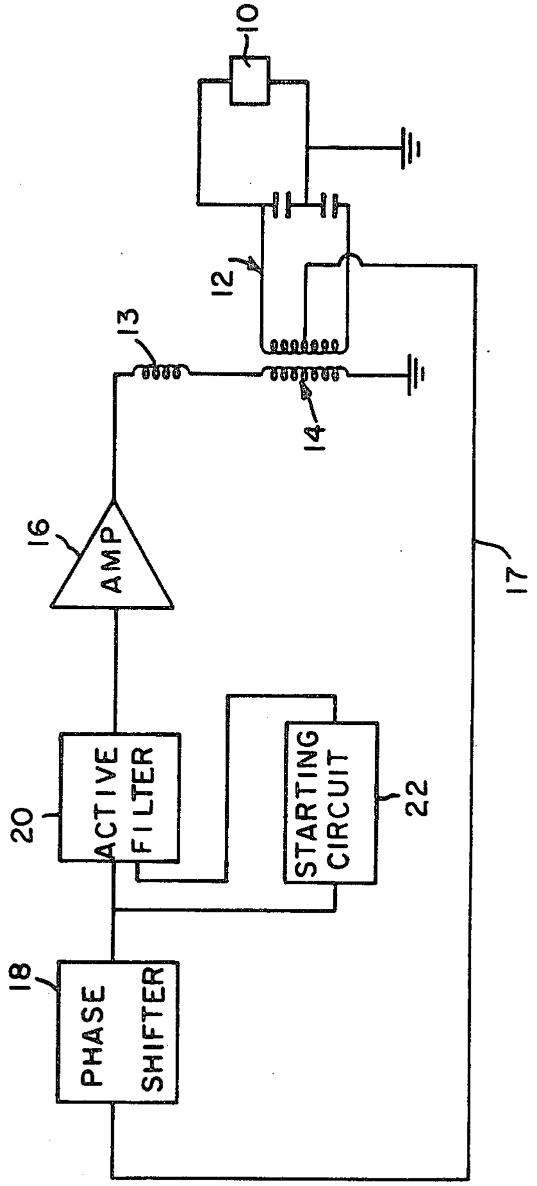
FIG. 1 is a schematic block diagram of the power supply of this invention used for energizing a transducer.

FIG. 1 is a block diagram of a self-resonant power supply for exciting piezoelectric transducers. Transducer 10 is operated in a motional bridge circuit 12 which, in turn, is coupled to the output of constant gain power amplifier 16 via transformer 14. The motional bridge circuit 12, not only serves to apply excitation power to the electro-acoustic transducer 10, but more importantly, it produces a sinusoidal feedback control voltage on line 17 that (1) corresponds directly with transducer tip frequency, amplitude and phase and (2) remains independent of nonreactive load changes on the transducer. Line 17 connects the motional bridge circuit 12 to the input of the all pass phase shifter circuit 18. Connected to the output of phase shifter 18 is an active filter circuit 20 and a starting circuit 22 to make filter 20 self oscillating. Active filter 20 is connected to the input of power amplifier 16 whose output is connected to transformer 14 through inductance 13 to drive motional bridge circuit 12.

Feedback control voltage on line 17 is the input to phase shifter circuit 18 which is used to tune the phasing of the input sinusoidal signal in such a predetermined amount and direction that the transducer vibrations are constrained to remain in the parallel resonance condition. It is important to note that only the phasing of the feedback signal, and not amplitude, is adjusted so as to not disturb loop gain and the mode suppression function of succeeding active filter circuit 20. Phase shifter circuit 18 is configured as a first-order all pass network with variable phase shift. Its output is a replica (except for phase) of the input AC feedback signal from motional bridge circuit 12.

Active filter 20 is a dual-purpose second-order Q-controlled band pass filter. The primary purpose of filter 20 is to prevent the power supply from driving the transducer system "out of band" into vibrational modes that have not been selected for use. Used in this way, it is called a mode suppressant filter. The secondary purpose of filter 20 does not appear unless the feedback signal on line 17 is lost completely, such as at startup. In this event, starting circuit 22 which monitors the output signal from phase-shifter circuit 18, causes the Q of active filter circuit 20 to increase to the point where filter circuit 20 breaks into oscillation. (Circuit Q is defined as the ratio of resonant frequency ($W_o$) to −3 dB bandwidth (BW) or $$Q = \frac{W_o}{BW}).$$

The frequency of oscillation is made to be coincident with the preselected natural parallel resonant frequency of the transducer system. The oscillator mode afforded by active filter 20 remains as long as needed to re-establish the feedback control signal on line 17 from motional bridge circuit 12.

Figure 2:
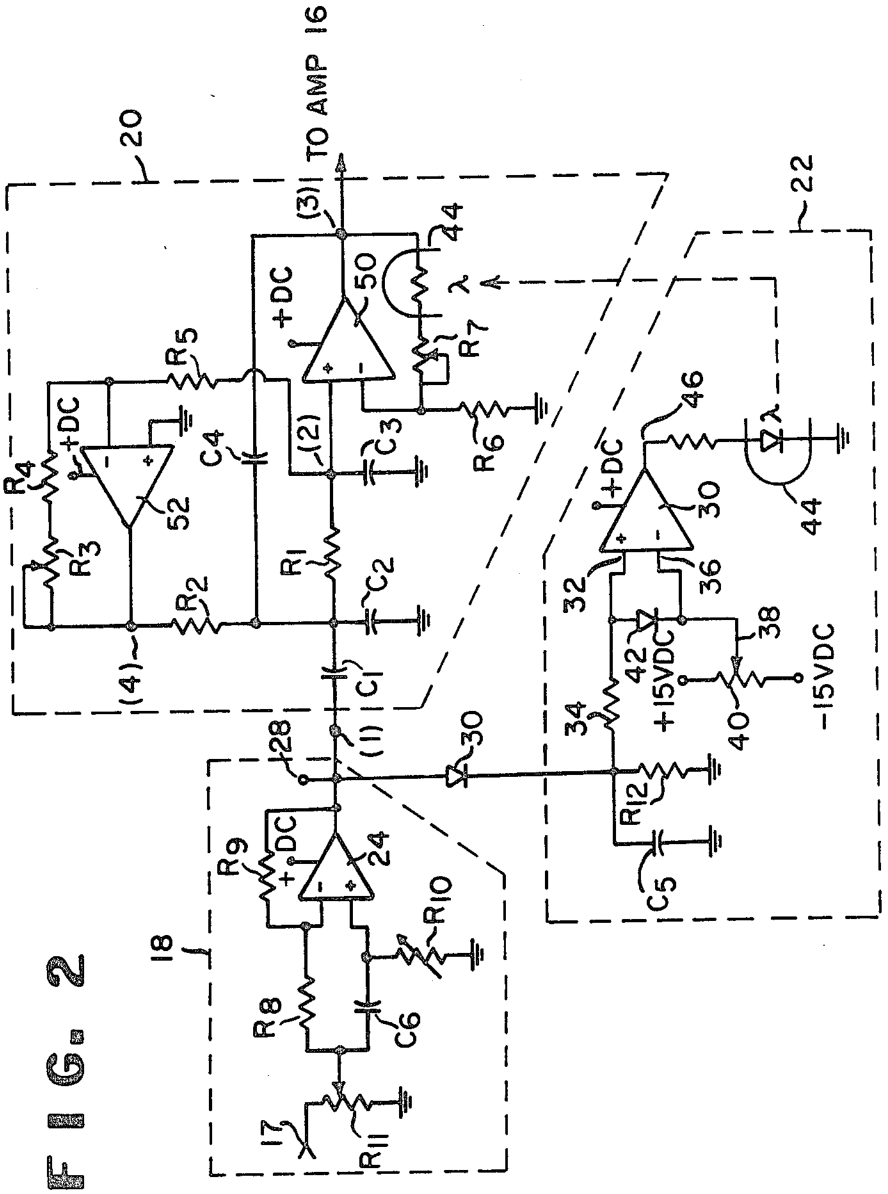
FIG. 2 is a circuit diagram of the all pass phase shifter and active filter implementation of the self starting oscillatory circuit of the power supply of FIG. 1.

FIG. 2 is a schematic circuit diagram showing the arrangement of the electrical elements constituting phase shifter 18, active filter 20 and starting circuit 22.

Phase shifter circuit 18 is a standard phase-lead circuit with unity gain that is built around operational amplifier 24, typically a TL074 manufactured by Texas Instruments. The potentiometer $R_{10}$ is used to initialize the phase difference between the sinusoidal feedback signal on line 17 and the AC output signal at terminal 28 to lie within the range of from 30° to 180°. Normally, pretuning specifies a phase lead close to the 180° limit. A diode rectifier 30, typically a IN914 manufactured by Motorola, couples the AC signal from the output of phase shifter circuit 18 into starting circuit 22.

Starting circuit 22 is designed around a voltage level comparator with operational amplifier 30, typically a TL074. This circuit low-pass filters the pulsating DC signal from the rectifier 30 and monitors the resultant signal level which appears at the non-inverting terminal 32 of operational amplifier 30 via a dropping resistor 34. While the inverting terminal 36 of operational amplifier 30 is connected to a set point value obtained from the arm 38 of potentiometer 40, a diode 42 with its anode connected to the inverting terminal 36 and its cathode attached to the non-inverting terminal 32 of operational amplifier 30 serves to guarantee activation of operational amplifier 30 in the presence of all signals with amplitudes greater than set point value. However, upon signal dropout, operational amplifier 30 switches off and deactivates photoresistor/LED 44. This element 44 connects the output terminal of 46 of operational amplifier 30 with active filter circuit 20, specifically in the feedback resistance $R_7$ path associated with operational amplifier 50. Active filter 20 comprises operational amplifiers 50, 52 that control the center frequency $W_o$ and the circuit Q respectively of active filter 20. Amplifier 50 is typically a model TL074 manufactured by Texas Instruments while amplifier 52 is a model VTL5C manufactured by Vactec.

It is important to note that active filter 20 can be represented mathematically by the following complex frequency domain transfer function $$H(s) = \frac{N(s)}{D(s)} = \frac{Ks}{s^2 + s\left(\frac{W_o}{Q} - G_1\right) + (W_o^2 + G_2)} \quad (1)$$

Where $s=jW$, $J=\sqrt{-1}$ and W is frequency in radians per second. s is the variable of transformation defined by the Laplace transform, K is a scale factor, and the $G_1$, $G_2$ terms in the denominator D(s) are parameters that relate directly to the two feedback amplifier gains $K_1$ and $K_2$. By proper selection of the G terms, the transfer function H(s) can be altered to represent either an oscillator with frequency $\sqrt{W_o^2+G_2}$, when $G_1=(W_o)/Q$, or a band pass filter of center frequency $\sqrt{W_o^2+G_2}$ and bandwidth $$\left(\frac{W_o}{Q} - G_1\right) \text{ for } G_1 < \frac{W_o}{Q}.$$

Figure 3A:
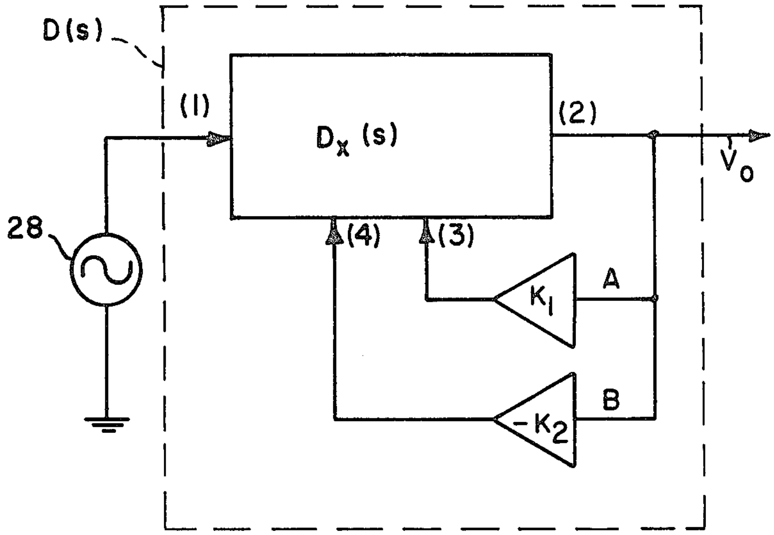
FIGS. 3A and 3B are, respectively, a block diagram of the active filter and a passive filter network that provides the characteristic function D(s) of the active filter implementation of this invention.
Figure 3B:
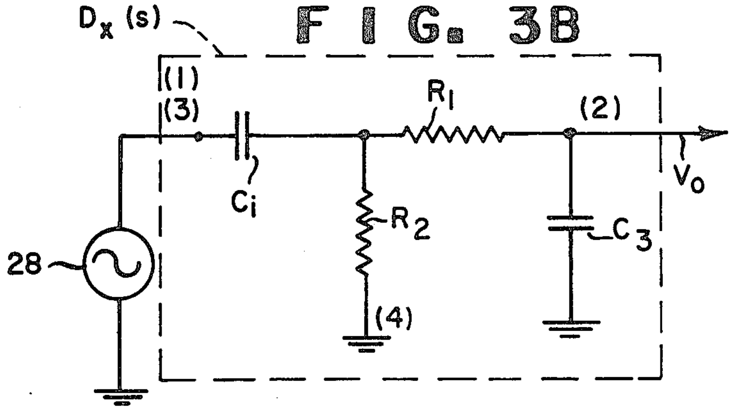

FIG. 3A is a basic block diagram of the preferred embodiment of the active filter 20. $D_x(s)$ indicates the system function for the passive filter network shown in FIG. 3B before active feedback is applied. The elements of FIG. 3B are those shown in FIG. 2, where $C_i$ is the value of the series-parallel combination of $C_1$ with $C_2$ and $C_4$, $R_1$=2.7K ohms, $R_2$=274K ohms, and $C_3$=0.0022 u Farads. The transfer function for the passive bandpass RC filter in FIG. 3B is:

$$H(s) = \frac{N_{12}(s)}{D_x(s)} = \frac{s(1/R_1C_3)}{s^2 + s\frac{(R_1C_3 + R_2C_i + R_2C_3)}{R_1R_2C_3C_i} + \frac{1}{(R_1R_2C_3C_i)}} \quad (2)$$

However, when active feedback is applied, as shown in FIG. 3A, the transfer function (2) then becomes:

$$H(s) = \frac{N_{12}(s)}{D_X(s) - K_1N_{32}(s) + K_2N_{42}(s)} \quad (3)$$

ps where $N_{12}(s)$, $N_{42}(s)$ and $N_{32}(s)$ represent the numerators of the transfer functions between the various nodes shown in FIG. 3A, and where $N_{12}(s)$ and $D_X(s)$ are given in equation (2).

As described above in connection with equation (1), by appropriately altering the feedback parameters $G_1$ and $G_2$, the power supply can be made to appear to the transducer as either an oscillator or a bandpass filter. FIG. 3A shows on way that this can be done. The addition of two tandemly arranged feedback paths A and B connect node (2) with nodes (3) and (4). Path A provides feedback with a gain $K_1$ into $D_X(s)$ to obtain Q control, whereas path B provides feedback with a gain $-K_2$ to provide center frequency control.

Comparing the circuits of FIG. 2 and FIG. 3A, we note that feedback path A comprises operation amplifier 50 with its gain $K_1$ set by resistors $R_6$, $R_7$, and a photoresistor 44 which is used to provide electronic gain control for the path. Feedback path B comprises operational amplifier 52, with inverting gain $K_2$ set by resistances $R_3$, $R_4$ and $R_5$.

Assuming a negligible loading effect of resistor $R_5$ on node (2), the transfer function of active filter circuit 20 from node (1) to node (3) is given by:

$$H(s) = \frac{N(s)}{D(s)} = K_1\left(\frac{C_2 + C_4}{C_i}\right)\left\{\frac{s(1/R_1C_3)}{s^2 + s\left[\frac{R_1C_3 + R_2C_i + R_2C_3}{R_1R_2C_3C_i} - K_1\left(\frac{C_2 + C_1}{C_i}\right)\left(\frac{1}{R_1C_3}\right)\right] + \left(\frac{1 + K_2}{R_1R_2C_3C_i}\right)}\right\} \quad (4)$$

or, equivalently, $$H(s) = \frac{Ks}{s^2 + s\left(\frac{W_o}{Q} = G_1\right) + (W_o^2 + G_2)} \quad (5)$$

which is identical to equation (1).

Although feedback paths A and B are shown to be particularly useful to provide Q and $W_o$ control, for the ultrasonic transducer, the concept of this invention does not restrict its use to dual feedback paths alone, as other realizations of the transfer functions of the form (4) may be formed.

Typical values of the component parts of the circuit illustrated in FIG. 2 are:

| Element No. | Value |
|---|---|
| $R_1$ | 2.7K ohms |
| $R_2$ | 274K ohms |
| $R_3$ | 100K ohms |
| $R_4$ | 100K ohms |
| $R_5$ | 100K ohms |
| $R_6$ | 33K ohms |
| $R_7$ | 200K ohms |
| $R_8$ | 10K ohms |
| $R_9$ | 10K ohms |
| $R_{10}$ | 10K ohms |
| $R_{11}$ | 10K ohms |
| $R_{12}$ | 24K ohms |
| $C_1$ | 100p farads |
| $C_2$ | .001u farads |
| $C_3$ | .0022u farads |
| $C_4$ | 001u farads |
| $C_5$ | .01u farads |
| $C_6$ | .002u farads |
| 34 | 47K ohms |
| 40 | 10K ohms |

In operation at start-up, there is no drive power supplied to transducer 10 through motional bridge 12 from power amplifier 16. However, starting circuit 22 continuously raises the Q of active filter 20 until it is caused to oscillate. With this signal, amplifier 16 drives transducer 10 into vibration at the parallel resonance condition. A portion of the signal from the motional bridge 12 is returned on feedback line 17 to cause starting circuit 22 to drop out and active filter 20 to revert to its normal mode suppressant state. Thus, the starting of loop oscillation is ensured and amplifier 16 continues to supply power to transducer 10 at its resonant frequency. Tuning of the power supply is then accomplished using the all pass filter/phase shifter 18, without affecting the operation of mode suppression filter 20.

I claim:

1. In a circuit for energizing by means of a motional bridge circuit an electro-acoustical transducer coupled to a load for transferring acoustic energy thereto including, a power amplifier circuit coupled to the motional bridge circuit for supplying an alternating cutrrent output for establishing a current flow to said transducer, and a feedback circuit connecting the motional bridge circuit to the power amplifier circuit for applying thereto an alternating current signal, the improvement comprising: an active filter, in said feedback circuit connected between said motional bridge circuit and said power amplifier circuit, said active filter being in a mode suppressant state; and a starting circuit coupled to said active filter for raising the Q of the active filter until it reverts from said mode suppressant state to a self-oscillating state when said alternating current signal is not present and for lowering the Q of said active filter until it reverts back to said mode suppressant state when said alternating current signal is present.

2. The circuit as defined in claim 1, said starting circuit being coupled to said active filter by means of a photoresistor.

3. The circuit as defined in claim 1, including an all pass phase shifter in said feedback circuit connected to the input of the active filter and to said starting circuit.

* * * * *